United States Patent [19]

Frazee

[11] 4,163,160

[45] Jul. 31, 1979

[54] INPUT STAGE FOR AUTOMOTIVE IGNITION CONTROL CIRCUIT

[75] Inventor: Jerome A. Frazee, Milpitas, Calif.

[73] Assignee: Fairchild Camera and Instrument Corporation, Mountain View, Calif.

[21] Appl. No.: 889,152

[22] Filed: Mar. 22, 1978

[51] Int. Cl.[2] ............................................ H03K 5/153

[52] U.S. Cl. .................................... 307/260; 307/228; 307/261; 307/350; 307/358; 307/309

[58] Field of Search ............... 307/350, 354, 355, 358, 307/228, 260, 261, 246, 309; 123/148 E

[56] References Cited

U.S. PATENT DOCUMENTS 4,066,968 1/1978 Guipaud ......................... 307/355 X

*Primary Examiner*—John Zazworsky

*Attorney, Agent, or Firm*—Alan H. MacPherson; Robert C. Colwell

[57] ABSTRACT

An input stage for an automotive ignition control circuit receives a signal from a pick-up device and generates in response thereto a control signal for charging and discharging a coil. The pick-up device is typically an open collector switch which controls the direction of flow of a current into or out of the input stage. This current is used to charge and discharge a capacitor in the input stage to produce a triangular waveform signal having a slope proportional to the duty cycle. The triangular waveform signal, together with a reference voltage signal, control a comparator which, in turn, controls the operation of the coil.

11 Claims, 6 Drawing Figures

FIG. 1
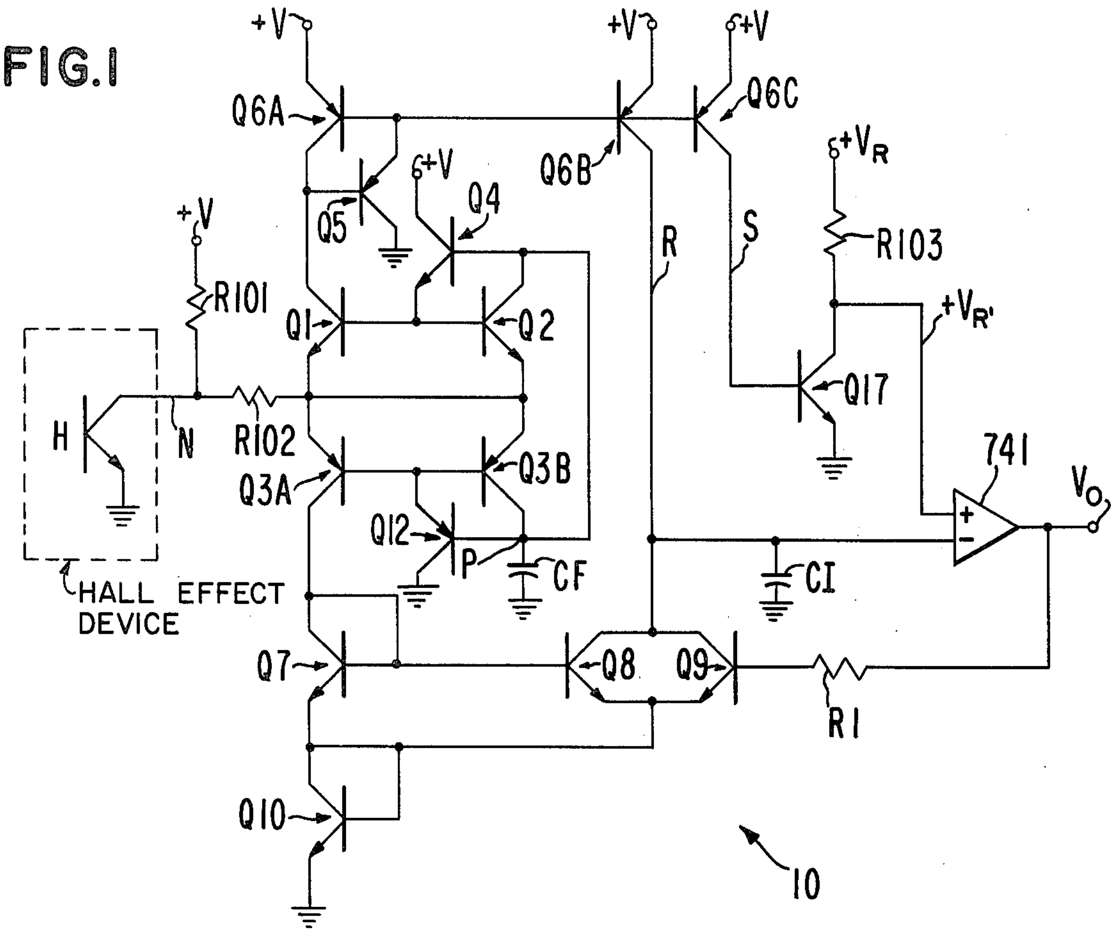
FIG. 2a
FIG. 2b
FIG. 2c
FIG. 2d
FIG. 2e
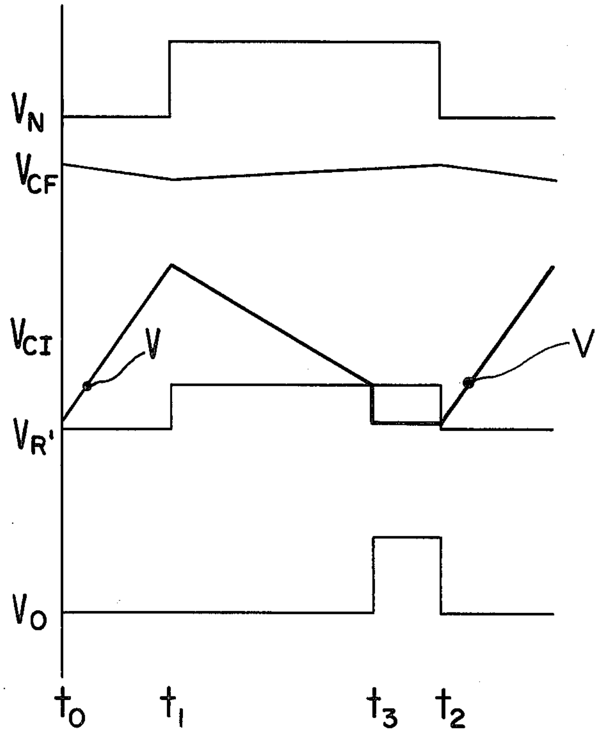

INPUT STAGE FOR AUTOMOTIVE IGNITION CONTROL CIRCUIT

BACKGROUND OF THE INVENTION

1. Field of the Invention

This invention relates to electrical circuits, and in particular to a circuit for the input stage of an automotive ignition control circuit.

2. Prior Art

Until relatively recently the spark for igniting the fuel air mixture in the cylinders of internal combustion engines has been generated by electromechanical means, typically, a distributor rotor and cam which mechanically opened and closed electrical contacts to control a coil. The coil supplies sparks to the various cylinders in the proper sequence and for the proper duration. It is now well known, however, that performing this function electronically provides substantial advantages over the prior mechanical techniques. Unfortunately many of the electronic techniques for performing this function waste power by charging the coil for an excessively long period. In response to this concern, techniques have been developed for generating a control signal having the minimum on-time necessary to charge the coil.

In one prior art technique, now embodied in Fairchild Camera and Instrument Company product 7357, the minimum on-time necessary to charge the coil is generated by using a magnetic pick-up in the distributor which mechanically or electromechanically generates a nonlinear triangular waveform. Unfortunately such mechanical or electromechanical devices are expensive and require careful adjustment.

SUMMARY OF THE INVENTION

The present invention overcomes many of the disadvantages of prior art circuits and structures by providing an improved input stage for an automotive control circuit. The improved input stage generates a signal of the appropriate duration to control the charging of a coil to the appropriate current for the minimum time. The input stage is typically connected to some type of pick-up device which supplies signals indicative of the angular position of the crankshaft. One such device is a Hall-effect integrated circuit, for example Honeywell Micro Switch product 1AV2A connected to sense the position of the rotating shaft in the distributor, and supply corresponding signals to the input stage circuit.

In one embodiment of the invention a circuit is provided which charges and discharges a capacitor in response to signals from a Hall-effect device. By comparing the voltage across the capacitor, which varies according to a triangular waveform, with the voltage from a reference source, a signal may be supplied to the coil to charge it for a minimum appropriate period.

When the Hall-effect output transistor, or other pickup device, is on, a current flows from the input stage to ground. This current is split by a pair of transistors, with half the current charging a first capacitor and the other half charging a second capacitor and switching a reference voltage supplied to a comparator.

When the Hall-effect output transistor, or other pickup device, is off a current flows into the input stage to permit the discharging of the first and second capacitors. The voltage across the second capacitor when supplied to a comparator with the reference voltage, causes the comparator to generate an output to control the coil.

BRIEF DESCRIPTION OF THE DRAWINGS

FIG. 1 is a schematic diagram showing one embodiment of the input stage for an automotive ignition control circuit.

FIGS. 2*a*–2*e* are a series of timing diagrams illustrating the operation of the circuit shown in FIG. 1.

DETAILED DESCRIPTION OF THE INVENTION

FIG. 1 is a schematic diagram showing the input stage of an automotive ignition control circuit. The function of the input stage is to supply an output signal $V_0$ which may be amplified or otherwise processed and supplied to a coil to cause the coil to charge and discharge, to thereby generate the spark at the proper times for the various cylinders in an internal combustion engine.

Any of several well known devices, for example, the output transistor H of a Hall-effect device, essentially an open collector output amplifier, may be used to generate a waveform which is supplied on line N to the input stage 10 for the automotive ignition control circuit. As shown in FIG. 2*a*, the input signal $V_N$ on line N should be low between time $t_0$ and $t_1$, and the input signal should be open to allow line N to float between $t_1$ and $t_2$. Time $t_2$ is the beginning of the next cycle, and the spark from the coil is to occur at time $t_2$. Using a Hall-effect device this criteria is satisfied as the voltage level on line N will be low when the Hall effect is turned on and high when the Hall effect is turned off.

The switching of the Hall-effect output transistor H will cause a current to flow in and out of line N. When the Hall effect output transistor H is turned on at time $t_0$ a current $I_{out}$ will flow out of line N through the Hall effect transistor H to ground. This current $I_{out}$ is given by:

$$I_{out}=[V_{CF}-(V_{BEQ2}+V_{BEQ4})]/R102$$

where $V_{CF}$ and $V_{BEQ4}$ are the voltage across capacitor CF, $V_{BEQ2}$ is the base-emitter voltages of transistors Q2 and Q4, respectively, and R102 is the resistance of resistor R102. Q1 and Q2 are equal geometry transistors, which therefore cause the $I_{out}$ current to divide equally between the two of them. Therefore the current $I_{CF}$ at node P is given by:

$$I_{CF}=I_{out}/2$$

The current flowing through Q2 will discharge capacitor CF. The other half of the current is mirrored through transistors Q6A, Q6B, and Q6C. As is well known Q6A, Q6B, and Q6C, may be three transistors of the same size, and therefore, whatever current flows into Q6A also flows into Q6B and Q6C. In this manner equal currents are supplied on lines R and S.

The current on line R causes capacitor CI to charge linearly during the time that the Hall effect device H is on, that is, in FIG. 2*c* between $t_0$ and $t_1$. Because capacitor CF is substantially larger than capacitor CI the voltage across capacitor CF will not change as much as the voltage across capacitor CI. Compare FIG. 2*b* with FIG. 2*c*. Further, for most analysis, the voltage across capacitor CF may be considered a constant.

When the Hall-effect device turns output transistor H off (at time $t_1$ in FIG. 2c) the collector of transistor H goes high, causing a current $I_{in}$ to flow from the positive supply +V through resistor R101 to line N.

This current $I_{in}$ is given by:

$$I_{in}=[+V-(V_{CF}+V_{BEQ3A}+V_{BEQ12})]/(R101+R102)$$

where $V_{BEQ3A}$ and $V_{BEQ12}$ the base emitter voltages of transistors Q3A and Q12, respectively and R101 is the resistance of resistor R101 and R102 is the resistance of resistor R102. Because this current is split by Q3A and Q3B the current $I_{CF}$ at node P is given by:

$$I_{CF}=I_{in}/2$$

In most embodiments supply voltage +V will be the battery voltage of the automobile less any voltage drops caused by filters or other intervening devices.

The current flowing into input stage 10 on line N flows through Q3A and Q3B where it splits into two equal currents, with one-half adding charge to capacitor CF. The other half of the input current from transistor Q3A is mirrored by transistors Q7 and Q8 causing the voltage across capacitor CI to decrease as shown in FIG. 2c for the period between $t_1$ and $t_3$.

In steady state operation capacitor CF may charge or discharge only through the input line N. Therefore, after several cycles of operation, input circuit 10 will adjust itself so that the current flowing in multiplied by its duty cycle will be equal to the current flowing out multiplied by its duty cycle, where duty cycle is the ratio of on-time to off-time. Typically the duty cycle is defined mechanically by the dimensions of components within the distributor. Therefore the average voltage on capacitor CF will be stable when:

$$\frac{1}{2CF}\int_{t_0}^{t_1} I_{out}\,dt = \frac{1}{2CF}\int_{t_1}^{t_2} I_{in}\,dt$$

If capacitor CF is large so the change in $V_{CF}$ during a cycle is small, then $V_{CF}$ can be considered a constant, and $I_{in}$ and $I_{out}$ will be constant.

The equivalence of the current-duty cycle products provides a substantial advantage over prior art circuits in which node P is supplied with a fixed voltage. Prior art circuits were extremely sensitive to dimensional changes in the Hall effect vanes, distributor, or other mechanical apparatus. In contrast, the circuit 10 of this invention allows node P to float, and therefore node P will seek the voltage level where the input currents flowing in and out of line N have the same proportion as the duty cycle.

Between time $t_1$ and $t_2$ the voltage across capacitor CI decreases until it reaches a reference voltage $V_{R'}$, which is generated by voltage $V_R$ across resistor R103. Reference voltage $V_{R'}$ will be switched on and off by the current from transistor Q6C. The switching of reference voltage $V_{R'}$ is shown in FIG. 2d. Were it not switched, signal $V_{R'}$ would cross signal $V_{CI}$ at point V shown in FIG. 2c, and signal $V_0$ would extend past time $t_2$, the desired turn-off time as shown in FIG. 2a. Therefore, only between time $t_3$ and $t_2$, that is, when $V_{R'} \geqq V_{CI}$, will voltage comparator 741 generate an output signal $V_0$. Comparator 741 compares the reference voltage $V_{R'}$ to the voltage $V_{CI}$ and when voltage $V_{CI}$ becomes more negative and crosses voltage $V_R$, the output of the comparator is switched on. This switches on the current to the coil. It is between time $t_3$ and $t_2$ that the coil (not shown) is charged, with the spark occurring at time $t_2$.

When the Hall effect device H switches to turn transistor Q6A on, transistor Q17 is turned on by the current from transistor Q6C. This pulls the reference voltage $V_{R'}$ down so that it goes below the low point of the $V_{CI}$ waveform to turn the comparator back off at that time ($t_2$). The effect of the changing relationship between voltage $V_{R'}$ and voltage $V_{CI}$ is to generate an output signal $V_0$ as shown in FIG. 2e which, as mentioned, is used to charge and discharge a coil and generate a spark.

Transistor Q10, connected as a diode, defines a voltage slightly above ground as the most negative voltage to which the $V_{CI}$ voltage may go. When the comparator turns on at time $t_3$ an output signal from comparator 741 through resistor R1 to transistor Q9, causes transistor Q9 to saturate and pulls the voltage $V_{CI}$ to that level. Voltage $V_{CI}$ is discharged by transistor Q9 and remains discharged during the time $t_3$ to $t_2$. At time $t_2$ the comparator switched off, causing transistor Q9 to switch off to allow the cycle to begin again. The reference voltage $V_{R'}$ is pulled down by transistor Q17 to a saturation voltage above ground. Transistor Q4, Q5 and Q12 are connected to reduce base current errors in the current mirrors.

The shape of the curves shown in FIGS. 2a through 2e will vary depending upon the rpm at which the engine, and therefore, the distributor, is operating. In general, increasing the rpm will compress the waveforms shown, i.e., shorten the period of each cycle, and decrease the magnitude of the $V_{CI}$ and $V_{CF}$ signals. At still higher rpm's $V_{CI}$ will be equal to or less than $V_{R'}$ at time $t_1$, and then $V_{out}$ will switch high at time $t_1$ and low at $t_2$. Therefore $V_O$ will follow $V_N$.

In one embodiment of the invention transistors Q1 and Q2 are matched to provide the same base-emitter voltage for a given collector current. Transistor pair Q3A and Q3B are also matched, as is pair Q7 and Q8, and set Q6A, Q6B and Q6C. In this embodiment the components of FIG. 1 have the following values or types:

| | | |
|---|---|---|
| Resistors | R1 | 2000 ohms |
| | R101 | 15000 ohms |
| | R102 | 5000 ohms |
| | R103 | 2000 ohms |
| Supply Voltage | +V | 12 volts |
| | $+V_R$ | 2.5 volts |
| Capacitors | CF | 4.7 microfarads |
| | CI | .47 microfarads |

What is claimed is:

1. An input stage circuit for supplying an output signal from an output node in response to an input signal supplied to an input node, said input stage circuit comprising:

a first and a second voltage supply for providing first and second reference voltages, respectively, wherein the first voltage supply is connected to the input node;

a first current divider for dividing a current flowing out of the input node into a first current and a second current;

a second current divider for dividing a current flowing into the input node into a third and a fourth current;

a first capacitor connected to be discharged by said first current and charged by said third current;

a second capacitor connected to be charged by said second current and discharged by said fourth current; and a voltage comparator connected to said second capacitor and to said second voltage supply for producing the output signal at the output node.

2. Structure as in claim 1 wherein the voltage comparator produces a first output signal when the second reference voltage is greater than the potential across the second capacitor.

3. Structure as in claim 1 wherein the fourth current causes the second capacitor to discharge.

4. Structure as in claim 1 wherein the first current divider comprises:

a first and a second transistor, having emitters connected to the input node and having bases connected together;

the collector of the second transistor is connected to its base and to the first capacitor to supply the first current; and the collector of the first transistor is connected to the second capacitor to supply the second current.

5. Structure as in claim 4 wherein:

a switch is connected to said second voltage supply to control the flow of current to the voltage comparator; and a first current mirror is connected to the collector of the first transistor to provide a fifth current of magnitude equal to the second current to operate said second voltage supply switch.

6. Structure as in claim 4 wherein the second current divider comprising:

a third transistor and a fourth transistor, having emitters connected to the input node, and having bases connected together;

the collector of the fourth transistor is connected to its base and to the first capacitor to supply the third current; and the collector of the third transistor is connected to the second capacitor to supply the fourth current.

7. Structure as in claim 6 wherein:

the base of a fifth transistor is connected to the output node;

the collector is connected to the second capacitor; and the emitter is connected to ground.

8. Structure as in claim 7 wherein:

a sixth transistor and a seventh transistor are connected between the second capacitor and the collector of the third transistor;

the bases of the sixth transistor and the seventh transistor are connected together;

the collector of the sixth transistor is connected to the collector of the third transistor;

the collector of the seventh transistor is connected to the second capacitor; and the emitters of the fifth, the sixth, and the seventh transistors are connected together.

9. Structure as in claim 7 wherein an eighth transistor is connected between the common emitters of the fifth, the sixth and the seventh transistors and ground.

10. Structure as in claim 9 wherein:

the collector and base of the eighth transistor are connected together and to the common emitters of the fifth, the sixth and the seventh transistors; and the emitter of the eighth transistor is connected to ground.

11. Structure as in claim 10 wherein the input signal supplied to the input node is supplied from a Hall-effect device.

* * * * *